United States Patent
Guo

(10) Patent No.: US 12,157,942 B2
(45) Date of Patent: Dec. 3, 2024

(54) VERSATILE VACUUM DEPOSITION SOURCES AND SYSTEM THEREOF

(71) Applicant: Ascentool, Inc., Palo Alto, CA (US)

(72) Inventor: George Xinsheng Guo, Palo Alto, CA (US)

(73) Assignee: Ascentool, Inc., Palo Alto, CA (US)

( * ) Notice: Subject to any disclaimer, the term of this patent is extended or adjusted under 35 U.S.C. 154(b) by 305 days.

(21) Appl. No.: 17/740,563

(22) Filed: May 10, 2022

(65) Prior Publication Data

US 2022/0380889 A1 Dec. 1, 2022

Related U.S. Application Data

(60) Provisional application No. 63/195,585, filed on Jun. 1, 2021.

(51) Int. Cl.
*C23C 14/56* (2006.01)
*C23C 14/24* (2006.01)
*C23C 14/35* (2006.01)

(52) U.S. Cl.
CPC .......... *C23C 14/56* (2013.01); *C23C 14/24* (2013.01); *C23C 14/243* (2013.01); *C23C 14/35* (2013.01)

(58) Field of Classification Search
None
See application file for complete search history.

(56) References Cited

U.S. PATENT DOCUMENTS

| | | | | | |
|---|---|---|---|---|---|
| 4,478,703 | A | * | 10/1984 | Edamura | H01J 37/3405 204/192.12 |
| 2005/0252766 | A1 | * | 11/2005 | Greenberg | C23C 14/024 204/192.12 |
| 2008/0121514 | A1 | * | 5/2008 | Guo | H01J 37/3405 204/192.12 |
| 2011/0076398 | A1 | * | 3/2011 | Lin | C23C 14/26 392/386 |
| 2012/0111270 | A1 | * | 5/2012 | Guo | H01J 37/3452 118/723 R |
| 2014/0205762 | A1 | * | 7/2014 | Shiono | C23C 14/22 427/523 |

* cited by examiner

*Primary Examiner* — Jason Berman
(74) *Attorney, Agent, or Firm* — SV Patent Service

(57) ABSTRACT

A versatile high throughput deposition apparatus includes a process chamber and a workpiece platform in the process chamber. The workpiece platform can hold a plurality of workpieces around a center region and to rotate the plurality of workpieces around the center region. Each of the plurality of workpieces includes a deposition surface facing the center region. A gas distribution system can distribute a vapor gas in the center region of the process chamber to deposit a material on the deposition surfaces on the plurality of workpieces. A magnetron apparatus can form a closed-loop magnetic field near the plurality of workpieces. The plurality of workpieces can be electrically biased to produce a plasma near the deposition surfaces on the plurality of workpieces.

19 Claims, 16 Drawing Sheets

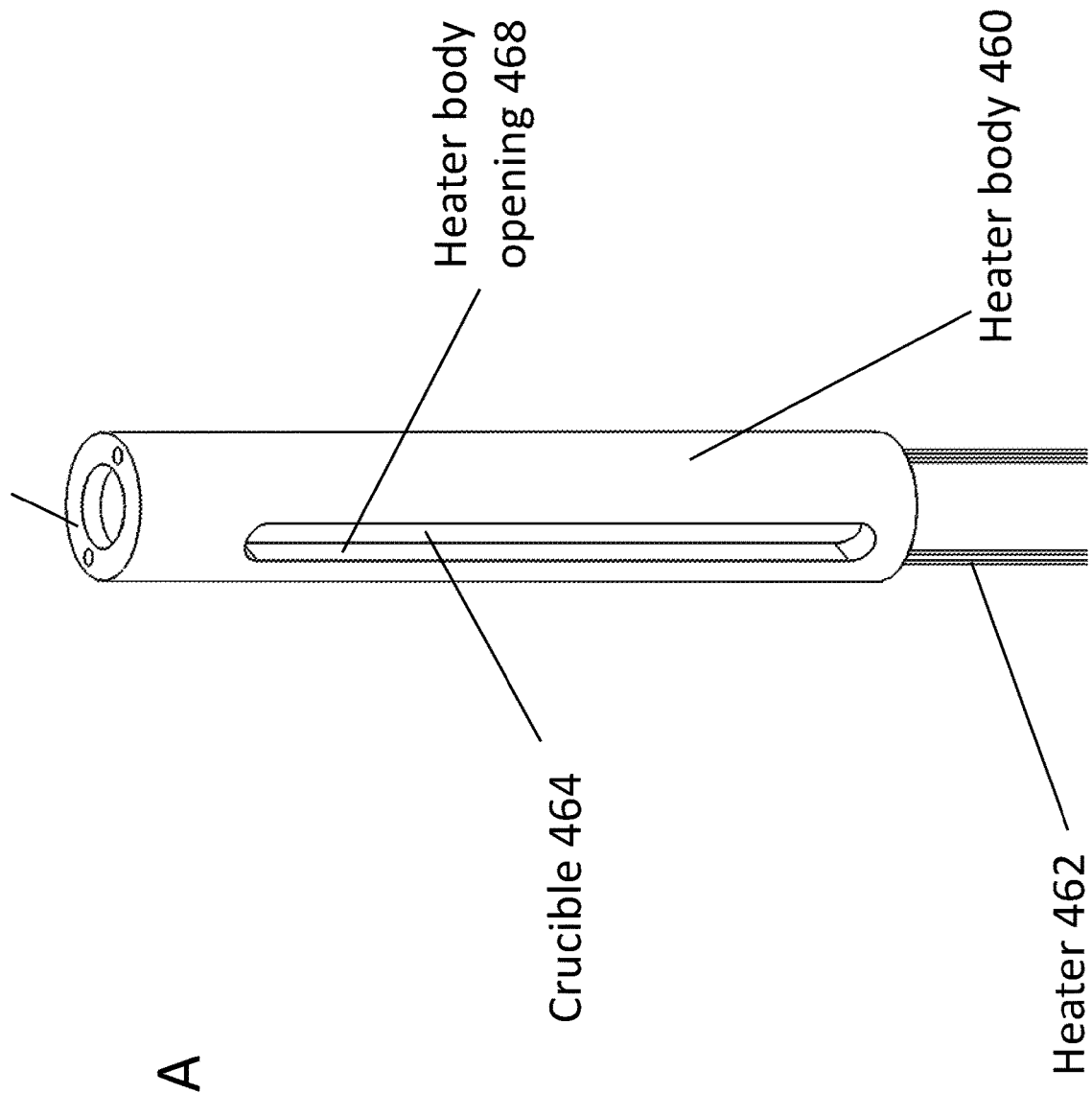

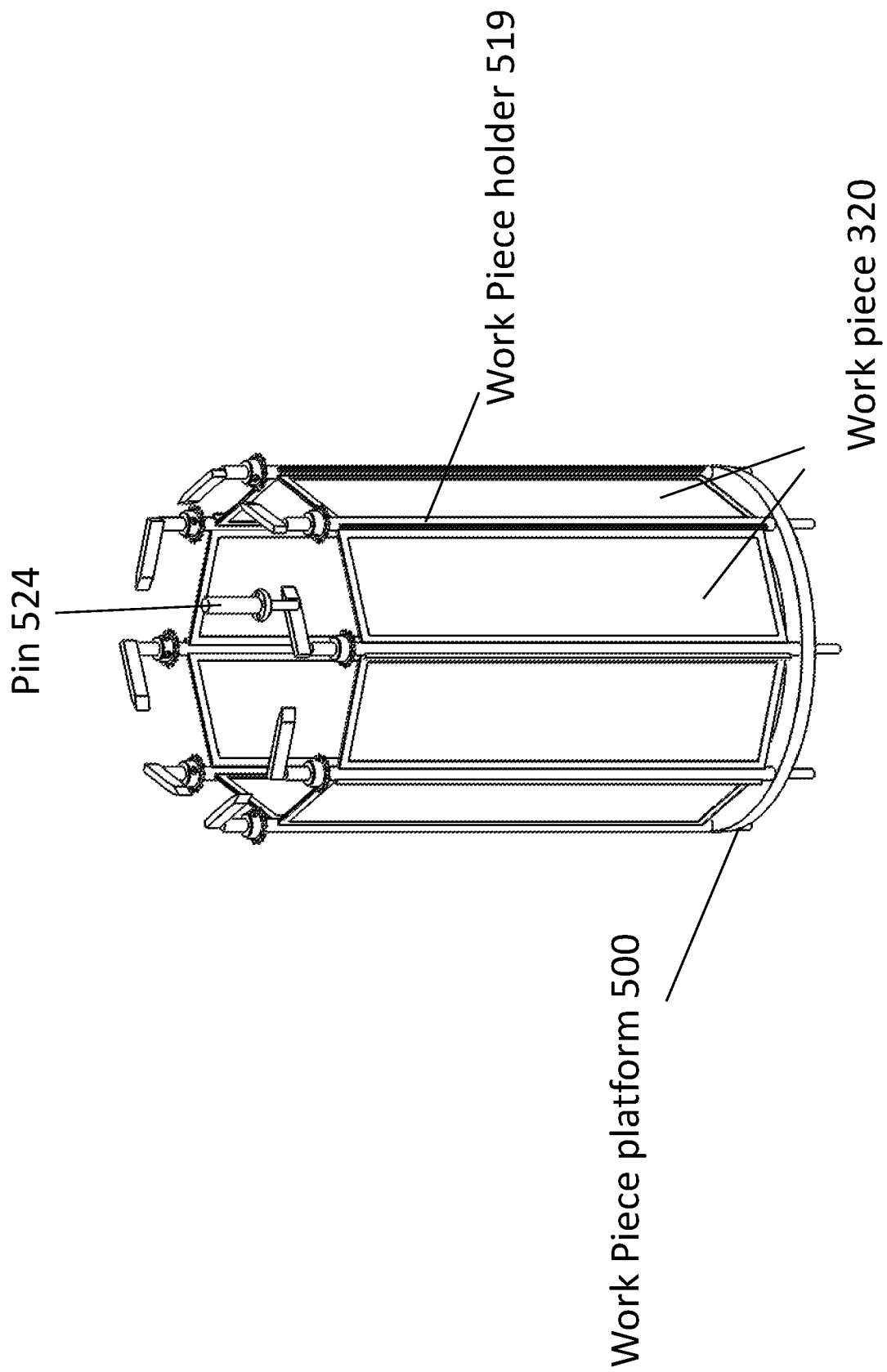

VERSATILE VACUUM DEPOSITION SOURCES AND SYSTEM THEREOF

BACKGROUND OF THE INVENTION

The present application relates to material deposition technologies, and more specifically to high throughput deposition apparatus.

Vacuum depositions such as sputtering, evaporation, sublimation, chemical vapor deposition (CVD), or plasma enhanced chemical vapor deposition (PECVD) are used in many industries to deposit materials on workpieces such as web, glass, semiconductor wafers, hard disks, et al.

PECVD is often applied between parallel plates to achieve good uniformity. One challenge for parallel-plate PECVD is the relative low plasma density and low densities of reactive species, which require relatively high process pressures to maintain stable plasma. The higher process pressure leads to low ionization efficiency and high rate of reactions in gas phase, resulting in low material utilization, powder formation and expensive waste gas treatment system. Another challenge for PECVD is deposition on the plasma sources, which can lead to particulates formation, clogging of gas distribution holes, and changes in plasma conditions. The in-situ cleaning of the plasma sources not only takes time, but is also impractical for some applications such as roll-to-roll web processing where the workpieces are always present.

Magnet field can bend electrons in plasma, increase ionizations, increase plasma density and decrease operating pressure. For example, magnetron sputtering operates at millitorr range, compared to hundreds of millitorr in PECVD, and can apply high power into the plasma. When precursor gas such as silane (SiH4) is flowed into the plasma, solid film will be formed in such apparatus. The higher rate of PECVD deposition will cover electrodes and other exposed surfaces; and prevent sputtering of deposition apparatus and reduce contaminations.

It is desirable to have the work piece as part of the deposition source where majority of deposition occurs on the work piece and there is no separate deposition source and hardware that can accumulate deposition materials. The deposition on work pieces will be removed along with the work pieces and new work pieces are moved in for next process. This can also be a continuous process flow. In this way, the deposition does not accumulate materials outside the work pieces, reducing the waste of deposition materials and increasing the lifetime of the deposition apparatus between clean.

In vacuum depositions, plasma can be formed between two work pieces when an electrical bias is applied between the two work pieces. If it is not practical to uses two work pieces as opposite electrodes, it is desirable to have small source-to-workpiece area ratios to minimize wasted deposition on deposition sources. To increase productivity, it is also desirable to have multiple workpiece processed at same time. For web processing, it is desirable to have minimum contact with web handling equipment, such as rollers. For some applications, multiple processing steps are carried out in the same system; the earlier processing step can produce intermediate deposited microstructures, which are strengthened by depositing thick films in later depositing steps. Any physical contact with the workpieces before the entire process is complete is detrimental to the workpieces.

In some applications, it is desirable to have multiple materials deposited on substrate sequentially, simultaneously, or in a repeat layered structure. The deposition can be different deposition sources using similar or different deposition technology such as PECVD, CVD, sputtering, evaporation or sublimation.

There is therefore a need for PECVD systems with high gas utilization, reduced gas phase reactions and powder formations, reduced or eliminated deposition on deposition sources and chambers, increased lifetime of deposition sources, compatible with deposition of multiple materials using multiple deposition technologies and increased system productivity.

SUMMARY OF THE INVENTION

The present application discloses a high throughput deposition source and system for PECVD. Comparing to conventional systems, the disclosed source and system have higher gas utilization, reduced gas phase reactions and powder formations, reduced or eliminated deposition on deposition sources, increased lifetime of deposition equipment, minimized the process condition variation throughout equipment lifetime, reduced waste treatment, increased system productivity, and can eliminate physical contacts between workpieces and deposition system during processing.

In one general aspect, the present invention relates to a versatile high throughput deposition apparatus that includes a process chamber, a workpiece platform that can hold a plurality of workpieces around a center region and to rotate the plurality of workpieces around the center region, wherein each of the plurality of workpieces includes a deposition surface facing the center region, a gas distribution system that can distribute a vapor gas in the center region of the process chamber to deposit a material on the deposition surfaces on the plurality of workpieces, and a magnetron apparatus that can form a closed-loop magnetic field near the plurality of workpieces, wherein the plurality of workpieces are electrically biased to produce a plasma near the deposition surfaces on the plurality of workpieces.

Implementations of the system may include one or more of the following. Each of the plurality of workpieces includes two or more deposition surfaces, wherein the workpiece platform is configured to rotate each of the plurality of workpieces to expose different deposition surfaces to the vapor gas in the center region to received deposition of the material. The workpiece platform can include multiple levers each configured to rotate one of the plurality of workpieces. The workpiece platform can hold the plurality of workpieces in a polygon or a circular pattern around the center region. The versatile high throughput deposition apparatus can further include an electrode in the process chamber, wherein the plurality of workpieces are electrically biased relative to the electrode. The electrode can be moved by a transport mechanism. There can be an electric bias between the plurality of workpieces. A portion of the closed-loop magnetic field can be substantially parallel to the deposition surfaces on the plurality of workpieces. The versatile high throughput deposition apparatus can further include: an evaporation source configured to provide the vapor gas to the work pieces, the evaporation source comprising: a crucible configured to hold the deposition material; and a heater configured to heat the deposition material in the crucible, wherein the crucible includes openings to release evaporated deposition material to deposit on the plurality of workpieces. The crucible and the openings can have elongated shapes aligned along a central axis through the central region, wherein the workpiece platform can rotate around the center axis. The evaporation source can be elongated and is aligned along a central axis. The magnetrons can be positioned on outside of the workpieces and away from a central axis. The crucible can receive a carrier gas to enhance deposition rate or to prevent contaminations from environment. The workpiece platform can hold the plurality of workpieces in a polygon or a circular pattern around the center region, wherein the evaporation source is positioned in the central region. The crucible is made of a porous material. The crucible is made of an electrically conductive materials configured to be heated by an electrical current. The evaporation source can further include an enclosure comprising openings to release evaporated deposition material to the plurality of workpieces, wherein the enclosure and the openings have elongated shapes. The crucible can be taller than the openings. The crucible can be filled with the deposition material at a level higher than the openings. The crucible can be heated in portions around the openings.

These and other aspects, their implementations and other features are described in detail in the drawings, the description and the claims.

BRIEF DESCRIPTION OF DRAWINGS

FIGS. 4A-4B show details of an evaporation source in accordance with some embodiments of the present invention.

FIGS. 5A-5F show details of a workpiece platform and rotation and self-rotation mechanisms of the workpieces in accordance with some embodiments of the present invention.

DETAILED DESCRIPTION OF THE INVENTION

Figure 1A:
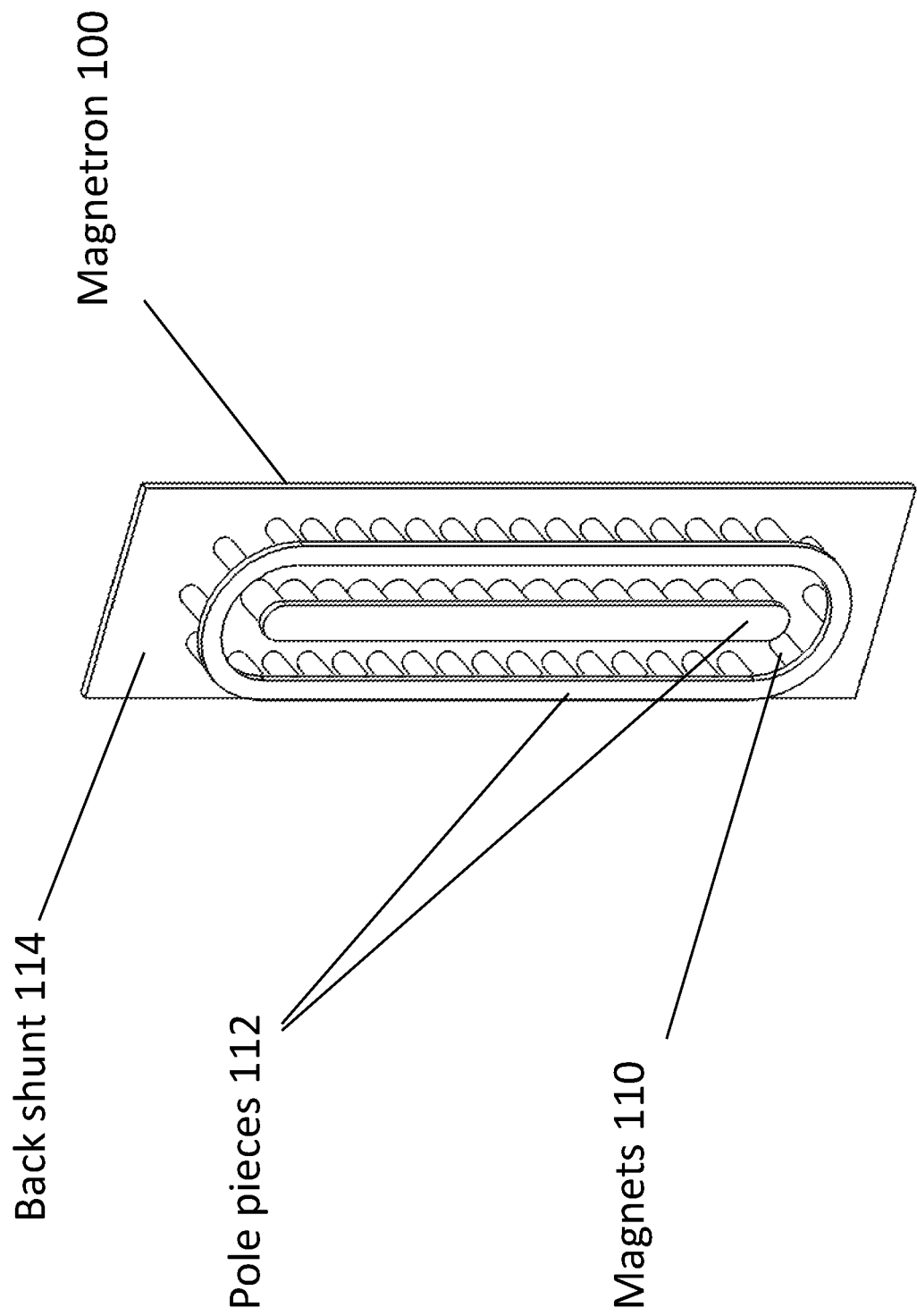
FIGS. 1A-1C show a closed-loop magnetron and relative positions of a workpiece and an electrode in accordance with some embodiments of the present invention.
Figure 1B:
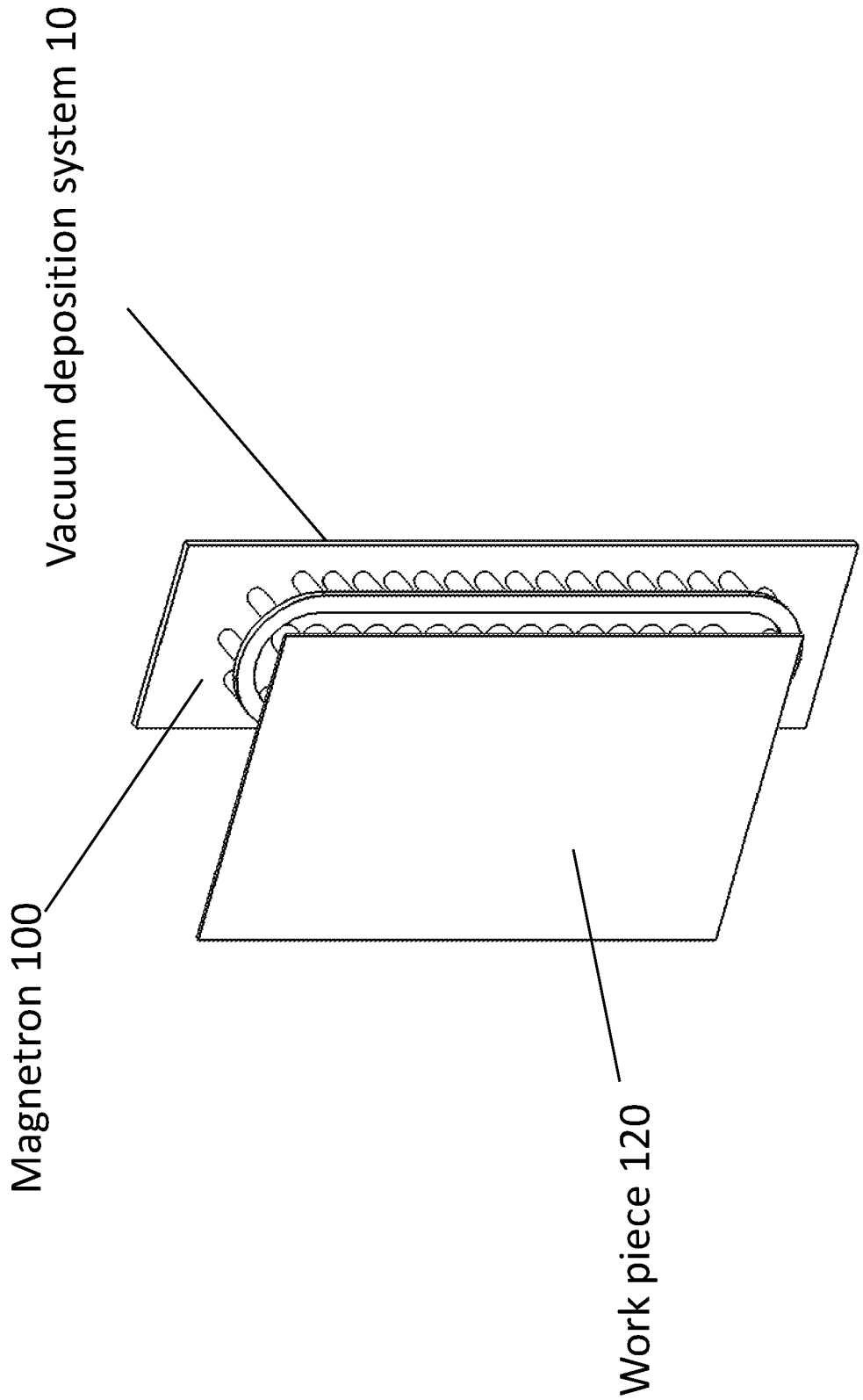

FIGS. 1A and 1B show a closed loop magnetron or a generic magnets apparatus 100, typically used in sputtering deposition. Magnets 110 are placed in two groups with opposite polarity to form magnetic fields, at least a portion of which are parallel to work piece surface 120. Optional pole pieces 112 can be used to spread out the magnetic field to improve magnetic field uniformity. Optional back shunt 114, made of para-magnetic materials is used to enhance the magnetic field strength on work pieces 120.

FIG. 1B shows a portion of a vacuum deposition system 10 comprising a magnets apparatus 100 that apply magnetic fields over one or more workpieces 120, which are placed inside a vacuum chamber (not shown). Plasma can be maintained when a voltage is place between the work piece 120 and an electrically separated part such as the vacuum chamber, other work pieces, ground, anodes, or cathodes.

Figure 1C:
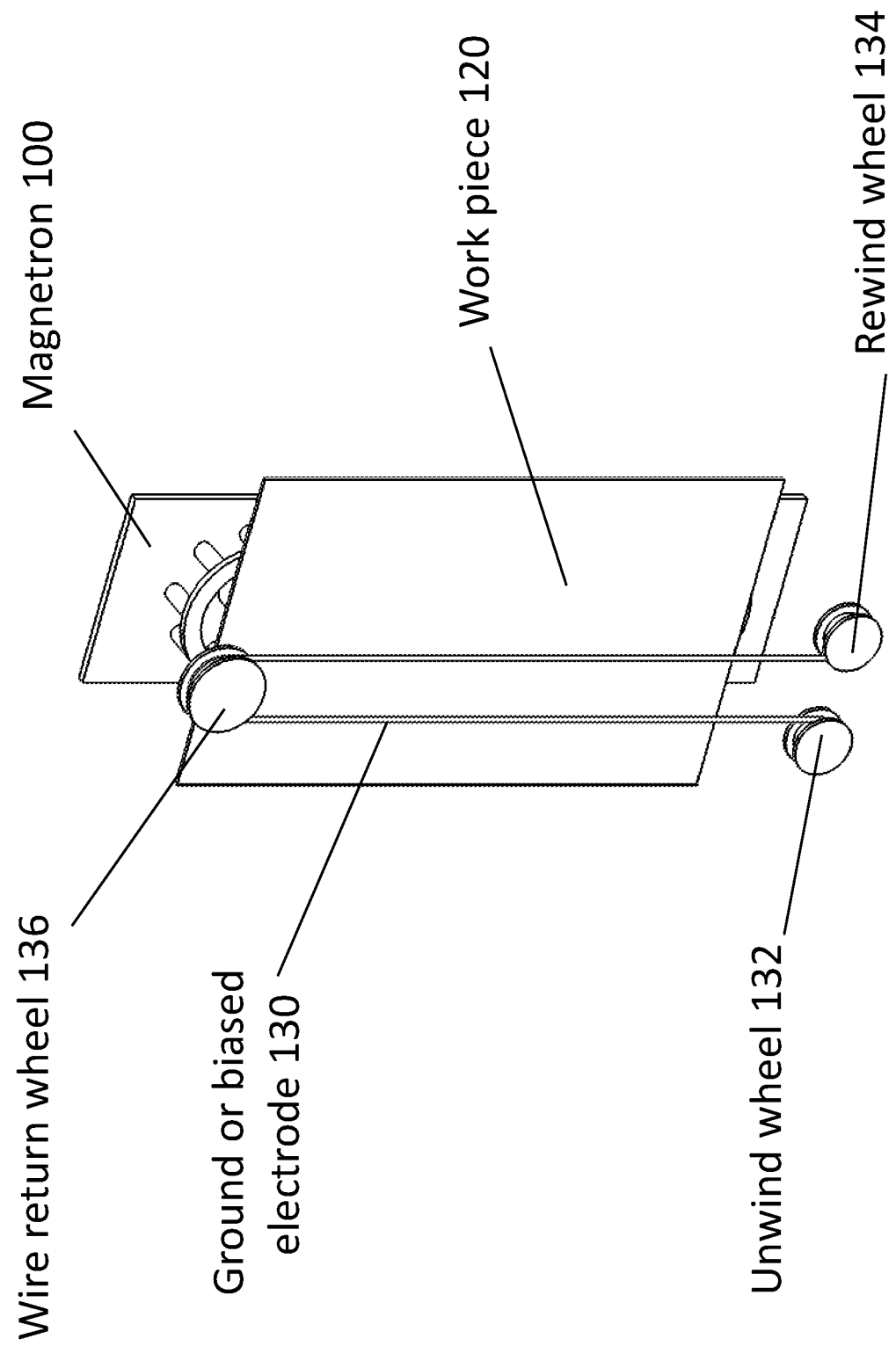

FIG. 1C shows an example where the counter electrode 130 to work piece 120 is in the form of a wire mounted between an unwind wheel 132 and a rewind wheel 134. A wire return wheel 136 is used to send back the wire to rewind wheel 134. The electrode can be much smaller in area, reducing the waste of deposition materials on the electrode, reducing the cost of the electrode and enabling the in-situ replacement of the electrode by moving fresh electrode into the plasma region. The wires can also go from unwind wheel to another wheel outside the process region, return to the process region and go to the rewind wheel. In this case, the total deposition thickness between the two sections of the wires will be approximately the same for each location along the work piece 120 to reduce the plasma and deposition non-uniformity. The counter electrode 130 can be made of electrical conductor or without moving mechanisms.

The magnetic field that is parallel to the surface of work piece 120 bend electrons and increase the electron path in the plasma and decrease the operating pressure. When the parallel magnetic field forms a closed loop over one or more work pieces, the plasma density is further enhanced. The magnetic field on work piece 120 will reduce the operating pressure that is required to maintain the plasma. If the magnetic field can confine the electron to closed loops over one or more work pieces, the operating pressure can be much lower, and the plasma can be very stable. When a precursor gas such as silane is introduced into the vacuum chamber, deposition can occur on the work pieces. The vacuum chamber (350 in FIG. 3B) maintains a desirable pressure. The atmosphere gases are evacuated and back filled with desirable gases such as argon, Silane, nitrogen, et al. The magnets apparatus 100 can be either inside the vacuum chamber or outside the vacuum chamber can be formed by either permanent magnets or electrical magnets. The arrangement of magnets can be different as long as the magnets produce a portion of magnetic fields that are parallel to work piece surface 120. For example, the permanent magnets 110 can be single type of magnets and polarity and are placed with their magnetized axis parallel to work piece surfaces 120.

In operation, a voltage such as direct current (DC), pulsed DC, alternative current (AC), high frequency including radio frequency (RF) power is applied between workpieces and either another work pieces, the ground, the electrodes or the vacuum chamber body to form a plasma with aid of the back filled gases. FIG. 1C shows additional electrode or electrical ground in the form of wire to form stable plasma with the work pieces. An in-situ replaceable counter electrode can greatly increase the lifetime of the deposition apparatus, but still add additional expenses and material waste. It is desirable to eliminate counter electrodes and use other work pieces as counter electrodes to each other to further reduce material waste and increase usable lifetime of the deposition apparatus.

Figure 2A:
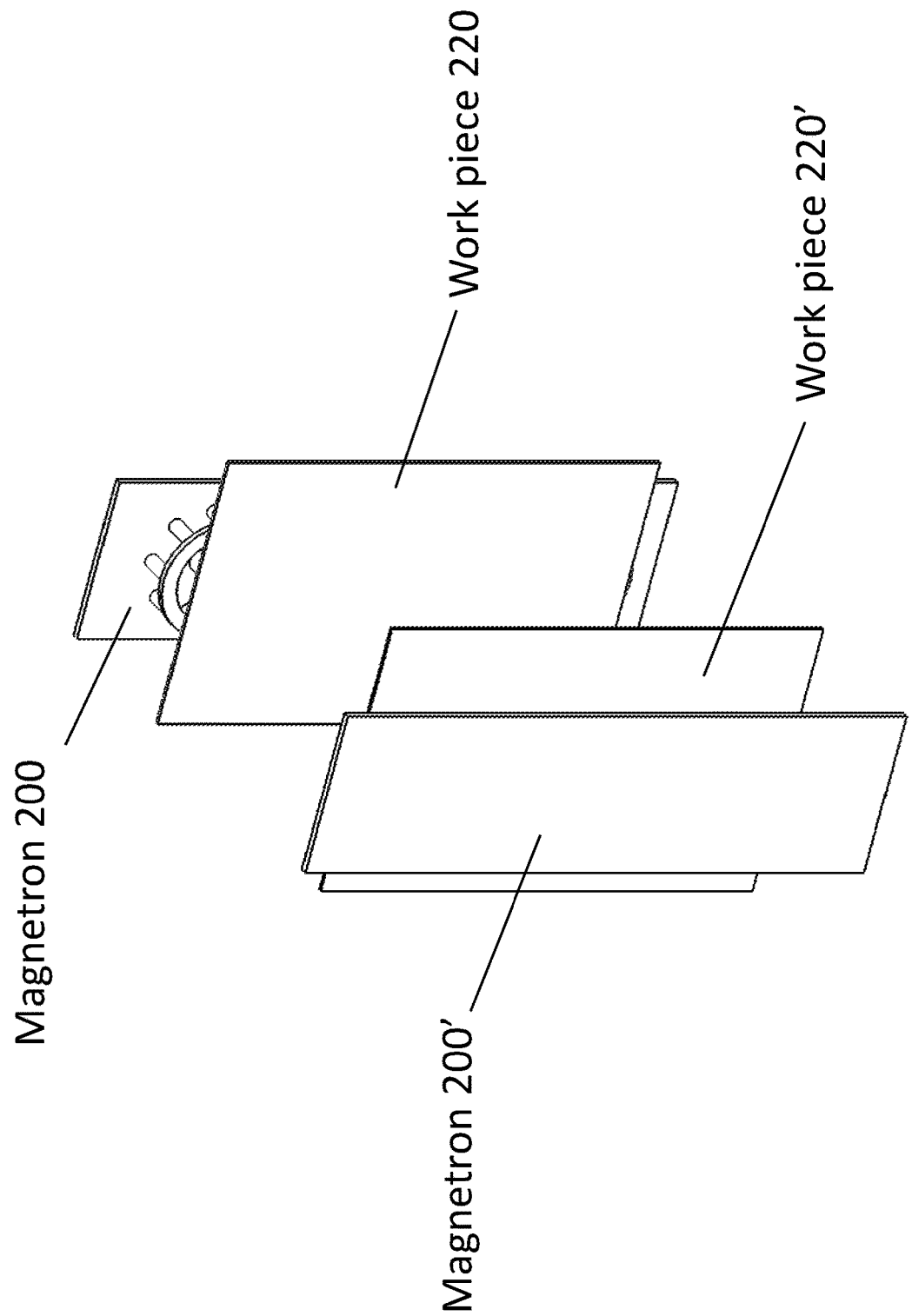
FIGS. 2A-2B show a pair of closed-loop magnetrons and positions of workpieces in accordance with some embodiments of the present invention.
Figure 2B:
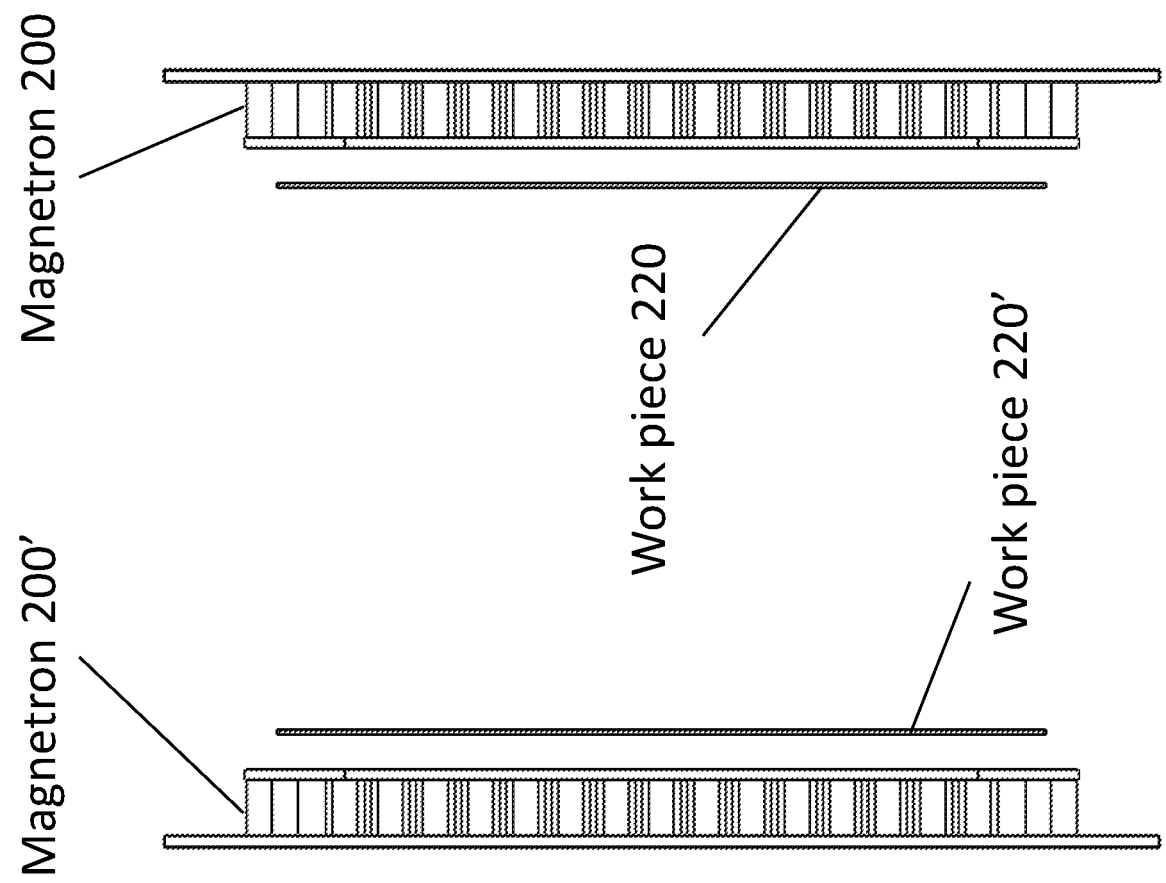

FIGS. 2A and 2B shows two sets of magnetrons 200, 200' and two sets of work pieces 220, 220' are biased against each other and form a plasma, this would confine the deposition region to the work pieces and largely eliminate waste of materials, changing of plasma conditions and particulate formation due to thick deposition on traditional deposition sources, and enable lower cost power sources such as DC, pulsed DC, or AC to be used due to the much thinner deposited materials on the work pieces compared to fixed electrode or deposition source which cannot be replaced frequently. The illustration shows the work pieces move horizontally; vertical movement, or circular movement can also be implemented to achieve uniform deposition. The work pieces can be webs, solid plates or other forms. The magnetron 200, 200' can be electrically isolated from work pieces, ground or other electrodes. FIG. 2B shows the side view.

The workpieces are electrically biased: they can be electrically biased against each other near each pair of magnetrons, a power source controls the amount of power passing through the plasma between the two sections of workpieces.

Figure 3A:
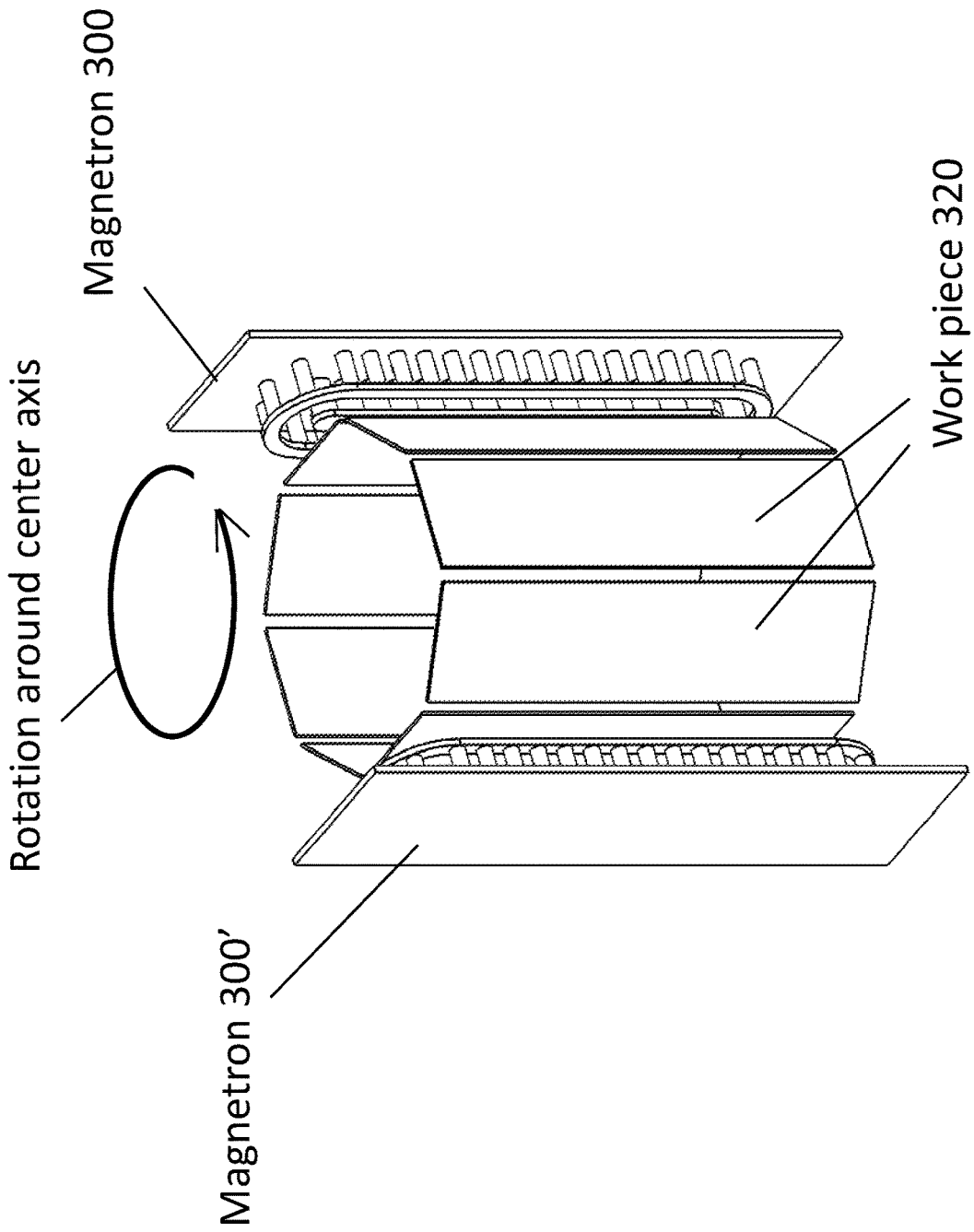
FIGS. 3A-3C show a pair of closed-loop magnetrons and workpieces surrounding an evaporation source in a vacuum chamber in accordance with some embodiments of the present invention.
Figure 3B:
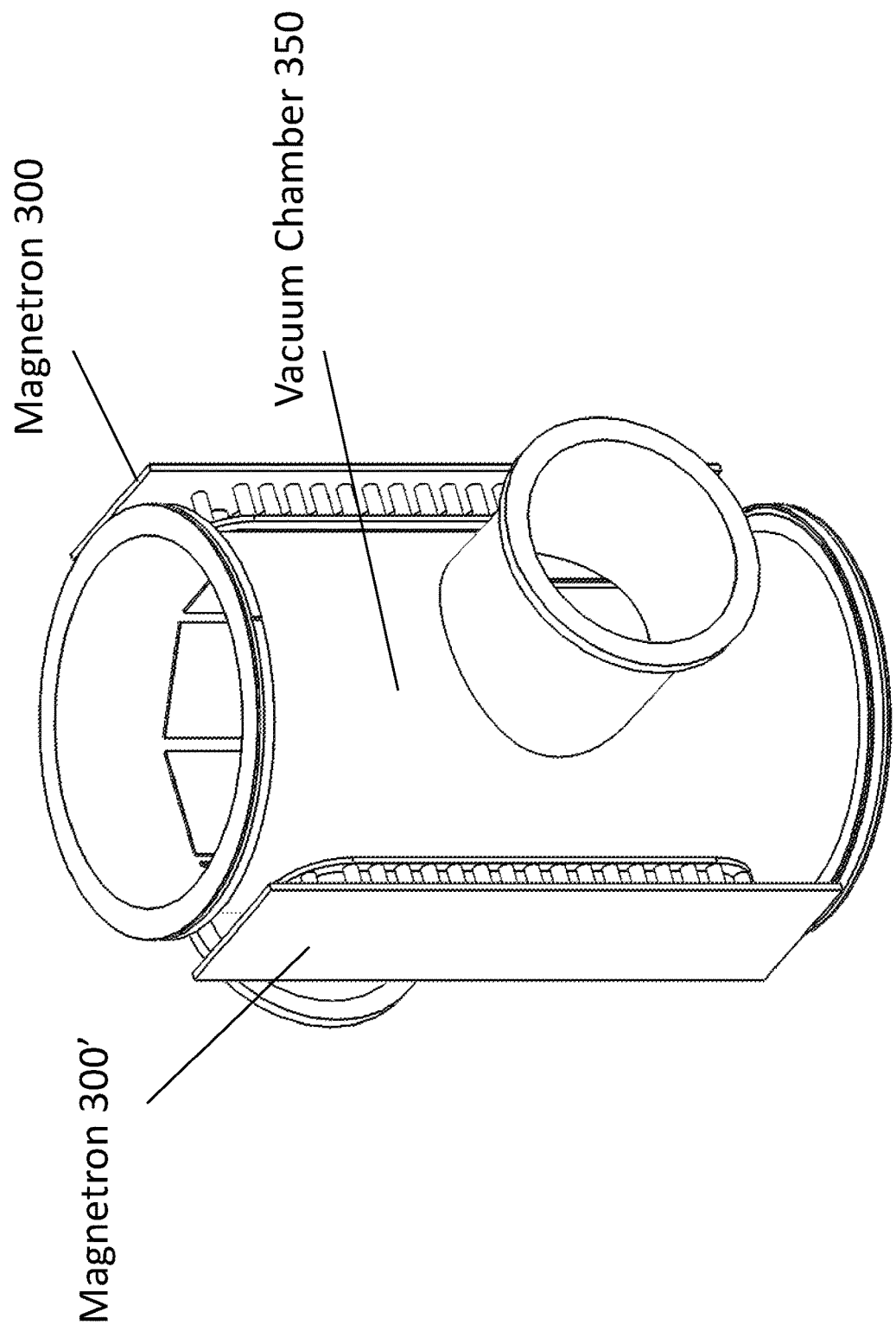

In order to achieve deposition uniformity and also to increase the productivity and throughput of the system. Multiple work pieces can be scanned over the magnetrons 300, 300'. FIGS. 3A and 3B show one configuration where work pieces are mounted in a polygon pattern, in between magnetrons 300, 300', without and with the vacuum chamber 350 shown respectively. The workpieces 320 rotate around the central axis of the vacuum chamber to improve deposition uniformity. The workpieces can be biased against each other at the two deposition regions, or biased at the same voltage against another electrode, ground or the chamber body, similar to FIG. 1C. It is possible to have one, two or multiple deposition regions for the same deposition process. In case two or more deposition regions are used, no separate counter electrodes are needed. Elimination of separate electrodes greatly reduces the consumption of precursor gases and reduces the material build up on these electrodes. Gas distribution can be inserted into the plasma region to increase gas utilization and deposition uniformity, with or without serving the functions of electrodes; the buildup on the gas distribution hardware does not affect plasma stability if the gas distribution is not part of the electrodes for the plasma. The rotation improves the deposition uniformity and lowers the heating by the plasma.

There can be additional deposition regions in the same vacuum chamber to either increase the system throughput or to deposit different materials. In one embodiment, shown in FIG. 3C, a third deposition, etch or processing source is placed inside the vacuum chamber either inside or outside the polygon formed by substrates to carry out deposition, etch, or other processing of the work pieces. The advantages of a rotating substrate system are smaller footprint, multilayer or repeat processing, and co-deposition.

The additional processing regions can carry out the heating, sputter etch of work pieces, deposition, etching, or other type of processing. One example is evaporation or sputtering deposition of Lithium during the silicon deposition to incorporate Lithium into the silicon material for Li ion battery anode production, or to create voids into the silicon structure. The operation of the third process region can be before, during, or after the deposition in the first process region. Cooling or heating regions can be incorporated in the vacuum chamber to cool or heat the work pieces.

Figure 3C:
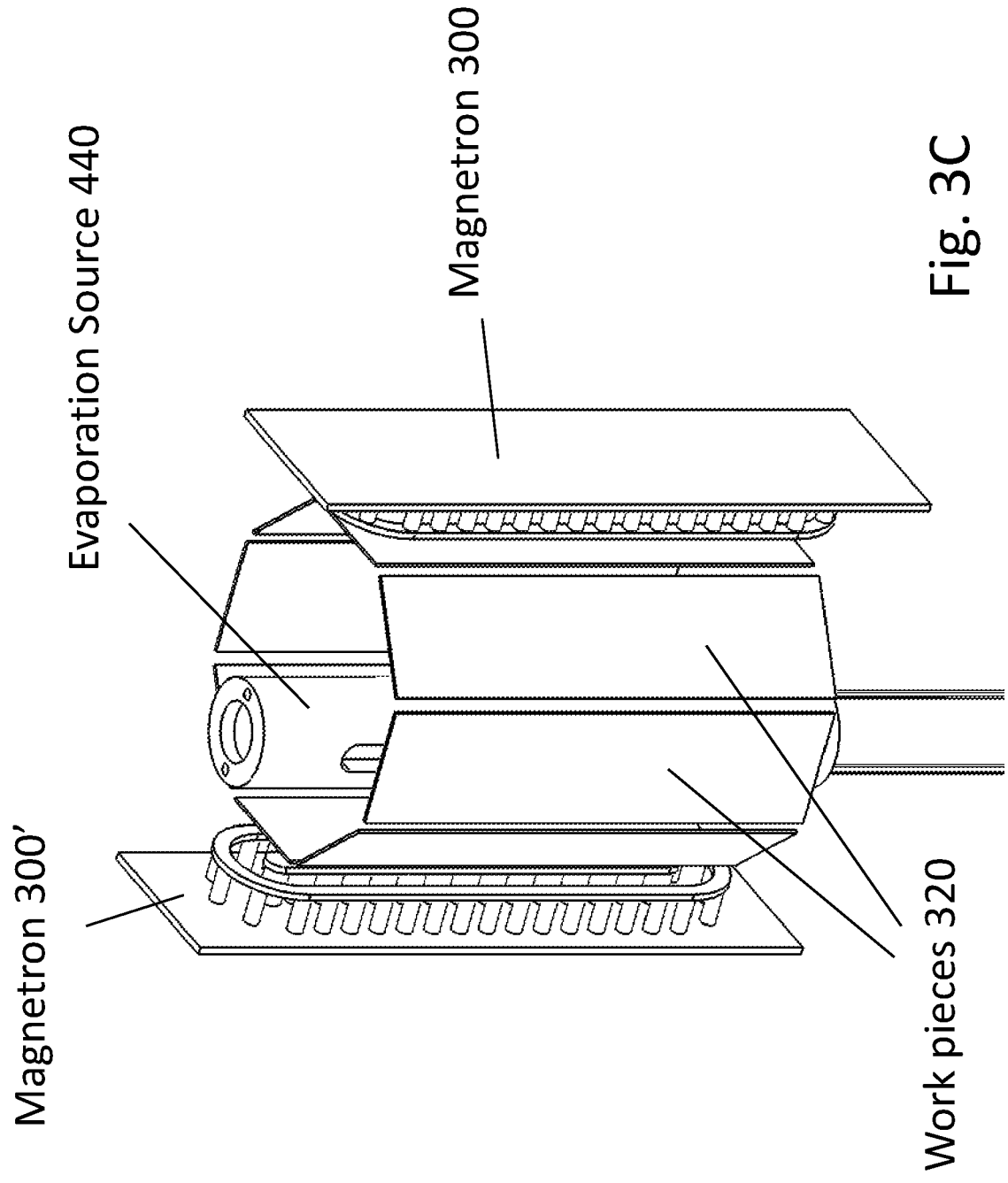
Figure 4B:
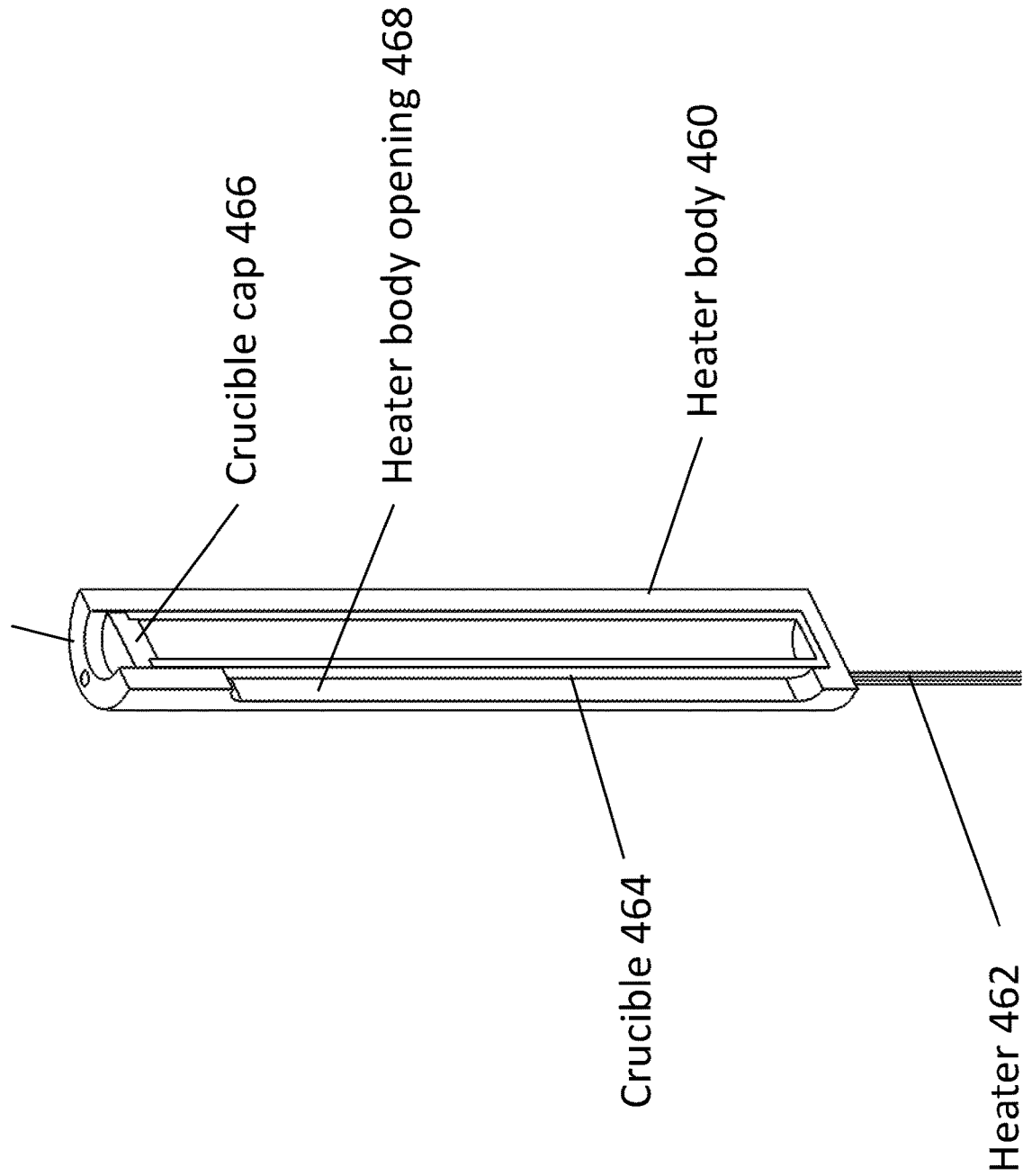

Referring to FIGS. 3C, 4A and 4B, a deposition source can deposition a second material, treat it to form droplets on the surface by heating or/and surface tension, deposit the first materials, and optionally repeat of this process. The second material can be Lithium and the first material can be silicon. The silicon anode manufactured in present invention can have Lithium incorporated inside anode (part of pre-lithiumization), and these Lithium can form clusters inside the silicon.

The evaporation source 440 can contain source materials such as Lithium in a crucible made of porous material such as porous Silicon Carbide 464, which is placed inside heater body 460. The heater body is heated by high temperature cartridge heaters 462 and controlled by varying electrical heating power and thermocouple monitoring. A crucible cap 466 can prevent escape of the vapor, and an opening 468 on the heater body facing the work pieces allows the vapor to reach the work pieces. The loading of the source material can be significantly more than covering the opening on heater body to maintain evaporation uniformity across the opening 468. The extra materials above the heater opening will refill the evaporated material below and keep the evaporation rate and uniformity much longer. Gas distribution holes can be drilled into the crucible to allow evaporated materials to exit the crucible, if the crucible is not permeable. In some embodiment, electrical current can be used to heat up the crucible directly when the crucible is made of conductive materials such as porous silicon carbide, solid silicon carbide, graphite, . . . etc.

Additional carrier gases such as Argon can flow into the porous crucible to increase the evaporation or solid sublimation rate during deposition. The Argon can also pressurize the crucible during opening of the vacuum chamber to air and prevent oxidation of evaporation source materials during chamber service or reloading of work pieces.

In some embodiments, the evaporation source 440 is not at the center region surrounded by the workpieces 320, but can be located outside a circle or polygon formed by the workpieces 320. A gas distribution system can guide the precursor gas to the central region to allow a precursor gas to be deposited on the workpieces 320. Moreover, the presently disclosed deposition system is different from a common type of sputtering system in which sources are mounted on chamber walls and the substrates are mounted on polygon and rotate around center of the chamber.

The presently disclosed deposition system makes the workpieces the primary sources, so that majority of deposition is on the work pieces, the magnetrons 300, 300' are electrically isolated from the plasma to avoid material deposition on or near the magnetrons 300, 300'. The magnetrons 300, 300' can be inside the circle or polygon formed by the workpieces 320. The magnetrons 300, 300' can be outside the polygon but inside the vacuum chamber, or outside the vacuum chamber.

Figure 5A:
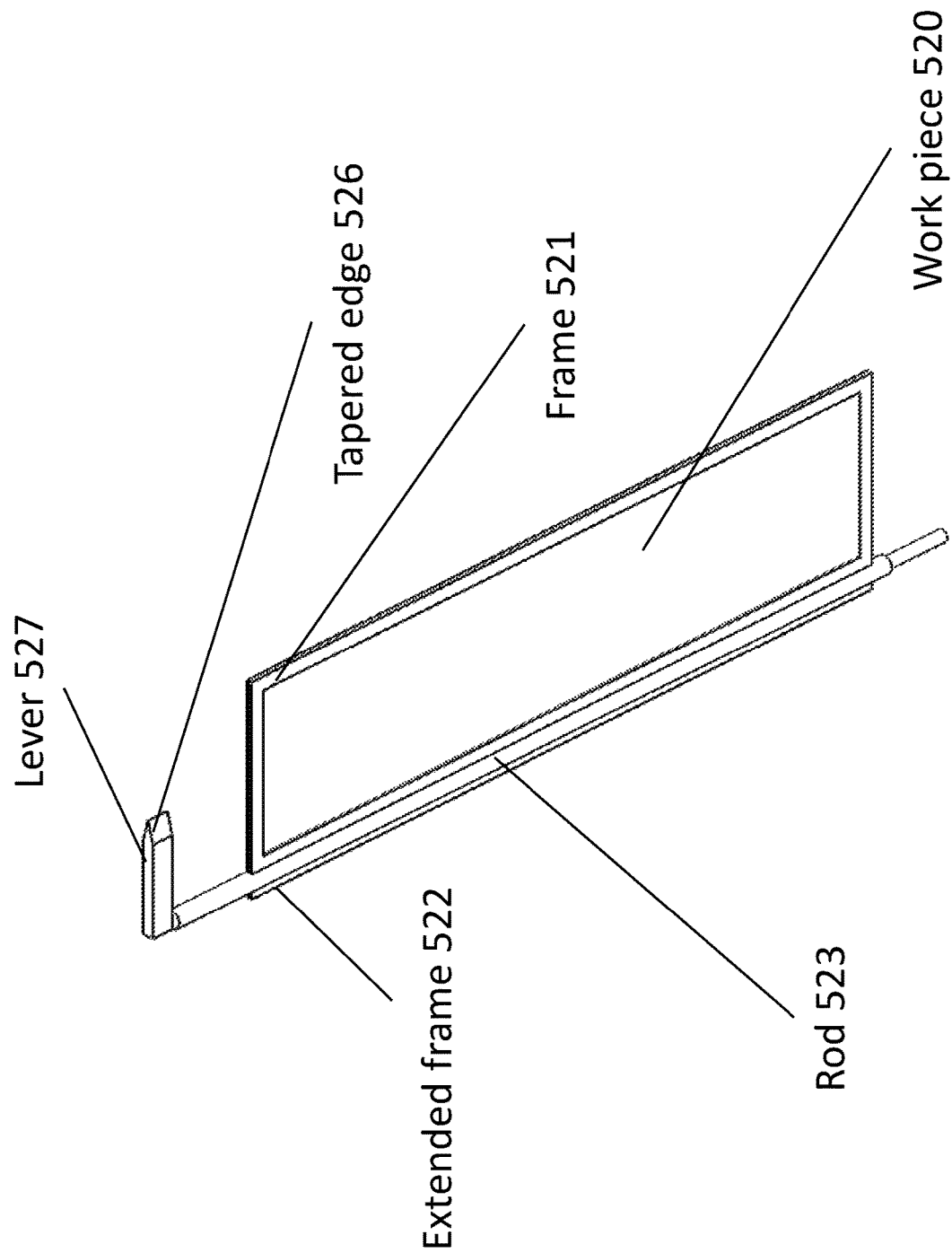

It is also possible to coat both sides of work pieces. FIGS. 5A-5F show a workpiece platform 500 that can hold and rotate multiple workpieces 520 such that different surfaces of workpieces 520 can receive deposition in a process chamber. In this embodiment, work pieces 520 are mounted onto a frame 521 which is attached to a rod 523 as shown in FIG. 5A. One example is the frame is made of two sheet metals with opening for work pieces, and the work piece is sandwiched between the two plates. There is a long slot in the rod 523 where the frame 521 is inserted through the slot with a small portion of the frame 522 extending beyond the slot. Set screws secure the frame to the rod 523 and press against the work piece to secure the work piece. Multiple frame and rods are mounted with equal distance between them on the same radius between lower plates 525 and top plate 526. A chain or belt (not shown) connects spokes 528 mounted on these rods 523 and can rotate all the rods and frames at same time. The rotation can be carried out without taking the work pieces out of process chamber. The rotation will be stopped by the extended frame 522 in the neighboring frames to avoid over-shoot. The rotation for each work piece can happen while all the work pieces are rotating around the vacuum chamber center axis.

In one embodiment, there is at least one lever 527 attached to one of the rods 523 in the work piece holder 519. The lever has a tapered edge 526. A pin 528 that can be lowered or raised into the rotation path of the lever 527 can induce the flipping of work pieces. The pin 528 can be mounted on the top cover or the bottom of the vacuum chamber and operated either manually or by a computer. When the pin 528 is lowered, the tapered edge 526 of lever 527 will hit pin 528 and slide along the outer surface of the pin 528 and rotate the rod 523 and all other rods linked by the chain or belt until the pin 528 disengage the lever 527 due to the rotation of work pieces around the central axis of the vacuum chamber. The work pieces and frames will hit stoppers and completely flip the side. The stopper can be the neighboring frame 522 as shown in FIG. 5A, or additional mechanical features. Optional magnets or other locking mechanism can ensure the frames stay in place. To flip back to the first direction, the work pieces and their frame would reverse the rotation direction around the axis of the vacuum chamber, pin 528 is lowered to guide lever 529 to rotate rod 523 back to the original position. Lever 529 may have different shape from 527 where the tapered edge and distance to the center of the vacuum chamber axis is such that the lever 527 or 527 can catch the pin 528 in their respective rotating directions. The rotation of the work piece holder 519 is driven by external motors through one of more vacuum feedthroughs.

Figure 5B:
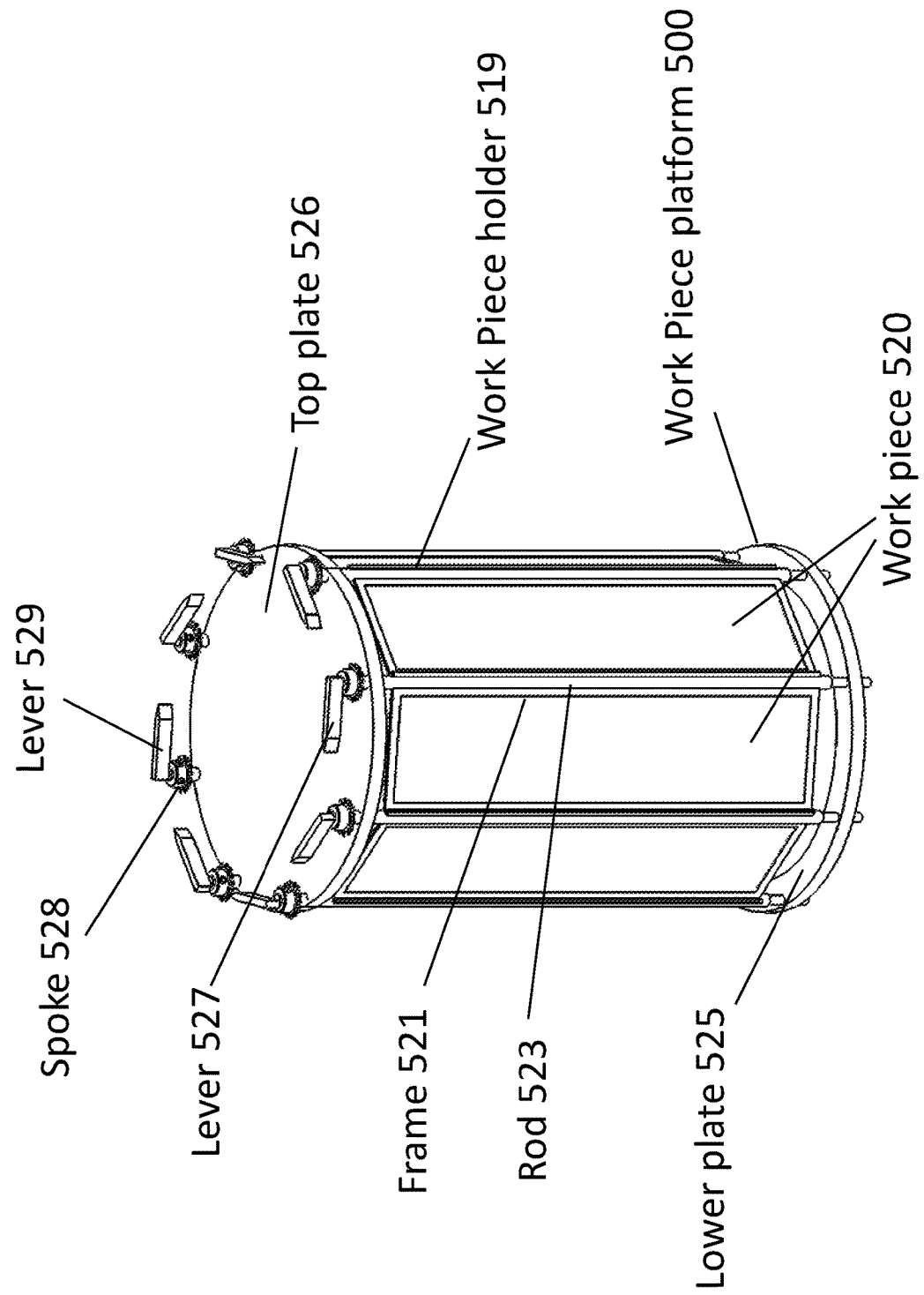
Figure 5D:
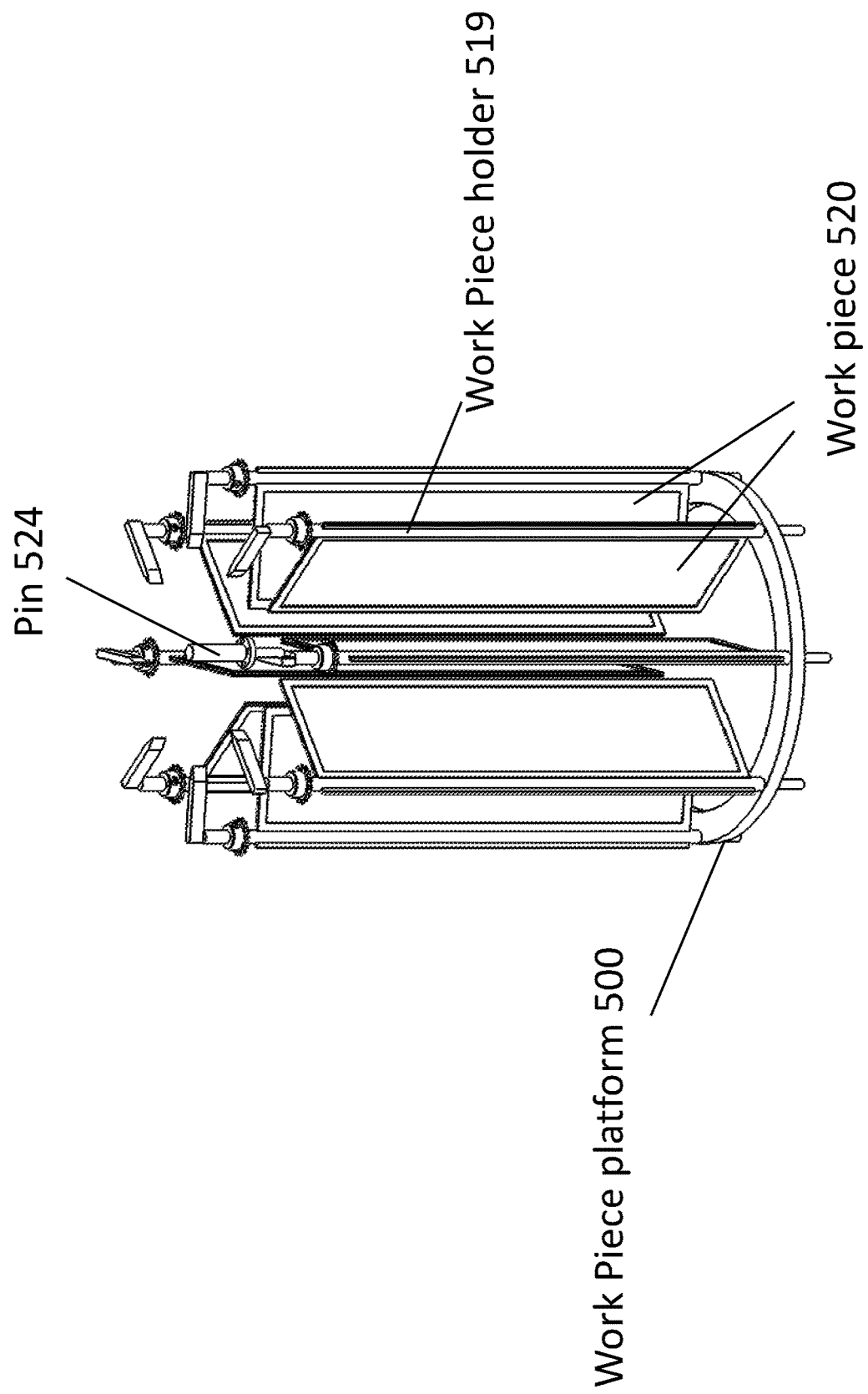
Figure 5E:
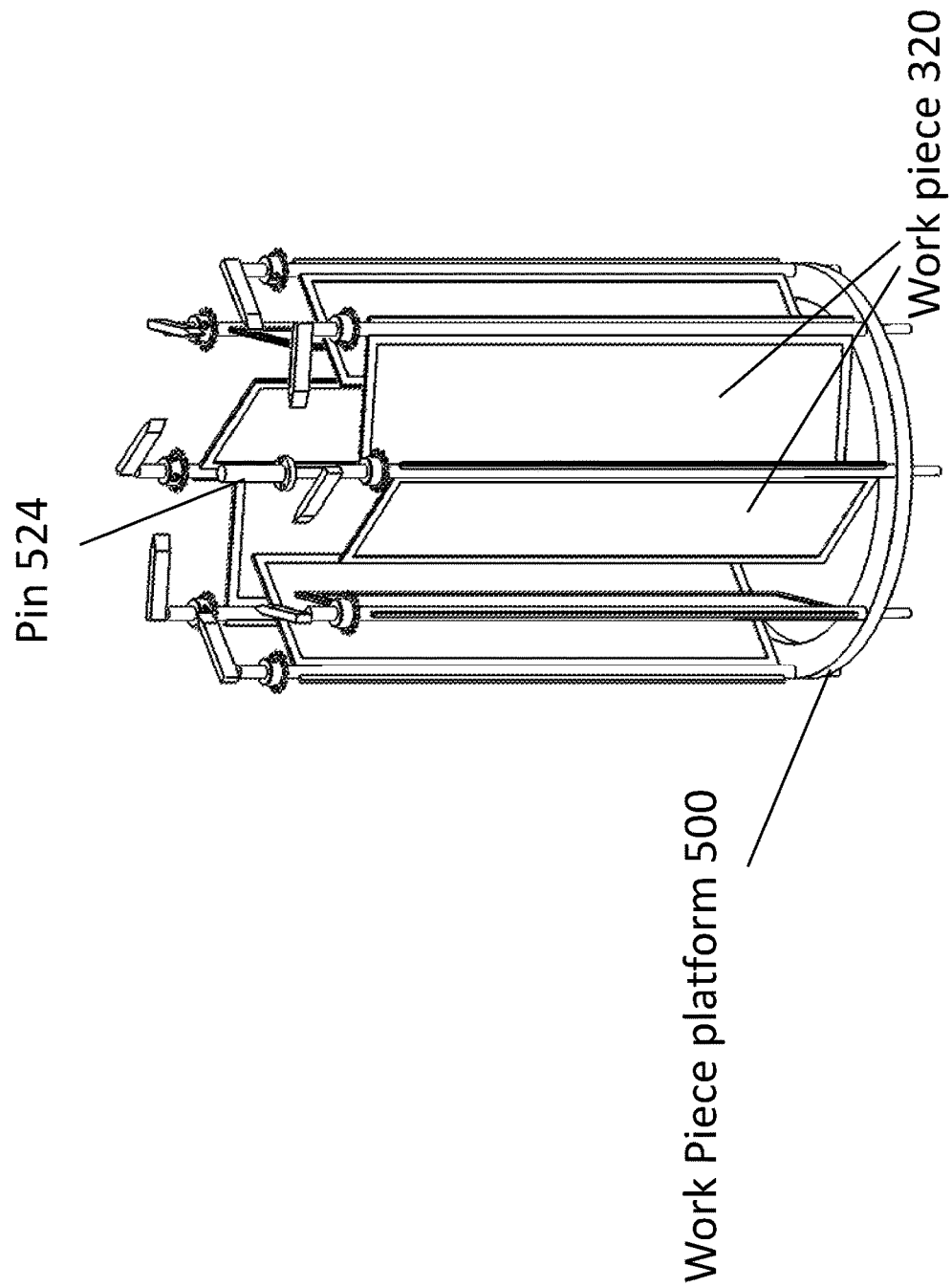
Figure 5F:
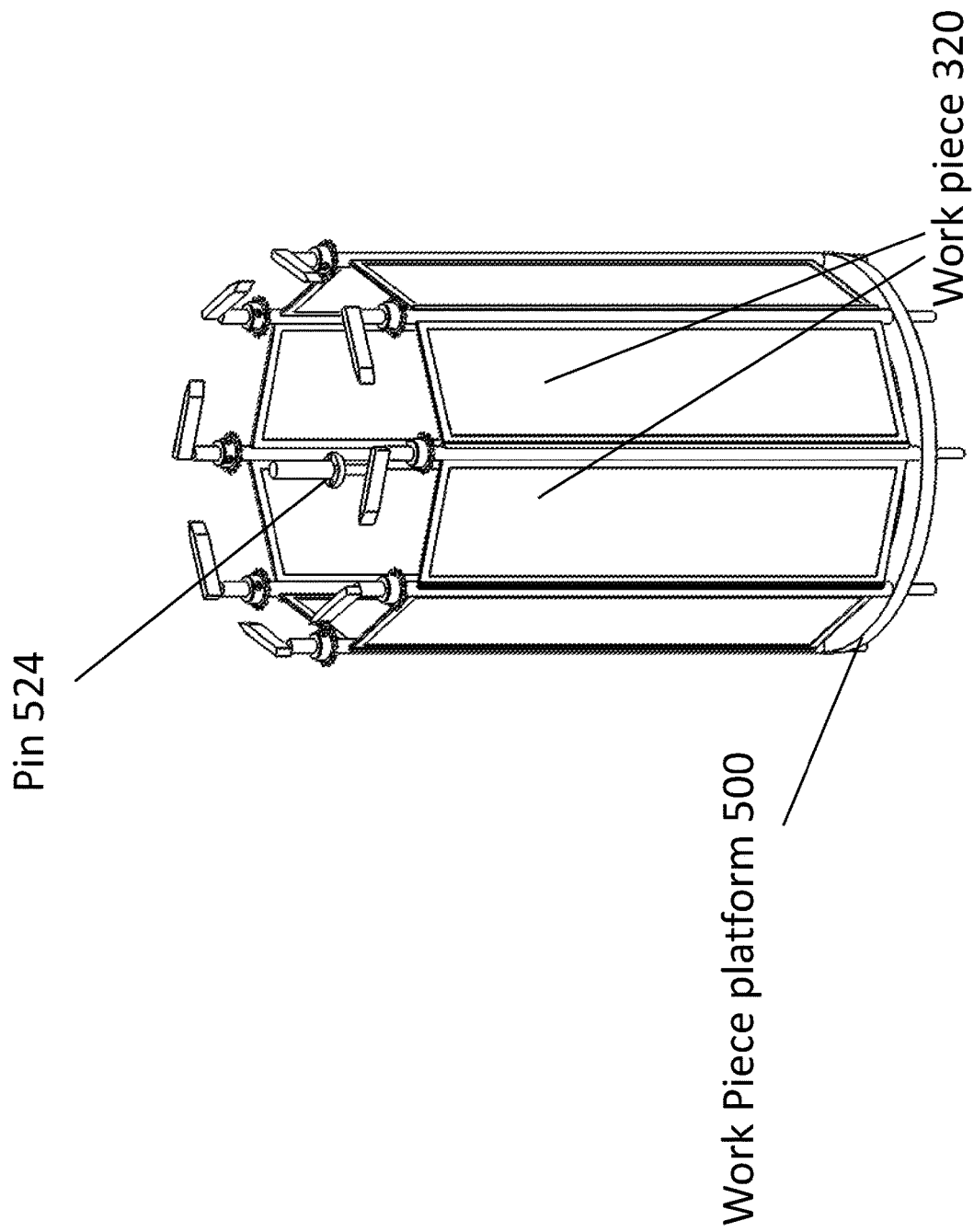

Alternatively, each frame 521, work piece 520, rod 523 and level 529 or 529 in FIG. 5B are separated from each other, they are flipped individually and/or independently as needed inside the vacuum chamber.

Only a few examples and implementations are described. Other implementations, variations, modifications and enhancements to the described examples and implementations may be made without deviating from the spirit of the present invention. For example, the disclosed deposition apparatus are compatible with other spatial configurations for the substrate, the deposition source, and substrate movement directions than the examples provided above. The PECVD sources can be of different types and configurations for the system.

What is claimed is:

1. A versatile high throughput deposition apparatus, comprising:
    a process chamber;
        a workpiece platform, in the process chamber, configured to hold a plurality of workpieces in a polygon or a circular pattern around a center region and to rotate the plurality of workpieces around the center region, wherein each of the plurality of workpieces includes a deposition surface facing the center region;
    a gas distribution system configured to distribute a vapor gas in the center region of the process chamber to deposit a material on the deposition surfaces on the plurality of workpieces; and
    a magnetron apparatus configured to form a closed-loop magnetic field near the plurality of workpieces, wherein the plurality of workpieces are electrically biased to produce a plasma near the deposition surfaces on the plurality of workpieces.

2. The versatile high throughput deposition apparatus of claim 1, wherein each of the plurality of workpieces includes two or more deposition surfaces, wherein the workpiece platform is configured to rotate each of the plurality of workpieces to expose different deposition surfaces to the vapor gas in the center region to received deposition of the material.

3. The versatile high throughput deposition apparatus of claim 2, wherein the workpiece platform includes multiple levers each configured to rotate one of the plurality of workpieces.

4. The versatile high throughput deposition apparatus of claim 1, wherein the workpiece platform is configured to hold the plurality of workpieces in a polygon or a circular pattern around the center region.

5. The versatile high throughput deposition apparatus of claim 1, further comprising:
    an electrode in the process chamber,
    wherein the plurality of workpieces are electrically biased relative to the electrode.

6. The versatile high throughput deposition apparatus of claim 5, wherein the electrode is configured to be moved by a transport mechanism.

7. The versatile high throughput deposition apparatus of claim 1, wherein there is an electric bias between the plurality of workpieces.

8. The versatile high throughput deposition apparatus of claim 1, wherein a portion of the closed-loop magnetic field is substantially parallel to the deposition surfaces on the plurality of workpieces.

9. The versatile high throughput deposition apparatus of claim 1, further comprising:
    an evaporation source configured to provide the vapor gas to the work pieces,
    the evaporation source comprising:
    a crucible configured to hold the deposition material; and
    a heater configured to heat the deposition material in the crucible,
    wherein the crucible includes openings to release evaporated deposition material to deposit on the plurality of workpieces.

10. The versatile high throughput deposition apparatus of claim 9, wherein the crucible and the openings have elongated shapes aligned along a central axis through the central region,
    wherein the workpiece platform is configured to rotate around the center axis.

11. The versatile high throughput deposition apparatus of claim 9, wherein the evaporation source is elongated and is aligned along a central axis,
    wherein the one or more magnetrons are positioned on outside of the workpieces and away from a central axis.

12. The versatile high throughput deposition apparatus of claim 9, wherein the crucible is configured to receive a carrier gas to enhance deposition rate or to prevent contaminations from environment.

13. The versatile high throughput deposition apparatus of claim 9, wherein the workpiece platform is configured to hold the plurality of workpieces in a polygon or a circular pattern around the center region, wherein the evaporation source is positioned in the central region.

14. The versatile high throughput deposition apparatus of claim 9, wherein the crucible is made of a porous material.

15. The versatile high throughput deposition apparatus of claim 9, wherein the crucible is made of an electrically conductive materials configured to be heated by an electrical current.

16. The versatile high throughput deposition apparatus of claim 9, wherein the evaporation source further comprises:
    an enclosure comprising openings to release evaporated deposition material to the plurality of workpieces, wherein the enclosure and the openings have elongated shapes.

17. The versatile high throughput deposition apparatus of claim 16, wherein the crucible is taller than the openings.

18. The versatile high throughput deposition apparatus of claim 16, wherein the crucible is configured to be filled with the deposition material at a level higher than the openings.

19. The versatile high throughput deposition apparatus of claim 16, wherein the crucible is heated in portions around the openings.

* * * * *